United States Patent
Hanna (10) Patent No.: US 7,893,676 B2
(45) Date of Patent: Feb. 22, 2011

(54) DRIVER FOR SWITCH AND A METHOD OF DRIVING THE SAME

(75) Inventor: John E. Hanna, Sun Lakes, AZ (US)

(73) Assignee: Enpirion, Inc., Bridgewater, NJ (US)

( * ) Notice: Subject to any disclaimer, the term of this patent is extended or adjusted under 35 U.S.C. 154(b) by 95 days.

(21) Appl. No.: 11/490,220

(22) Filed: Jul. 20, 2006

(65) Prior Publication Data

US 2008/0018366 A1 Jan. 24, 2008

(51) Int. Cl.
*H03K 17/30* (2006.01)
(52) U.S. Cl. .................... 323/284; 326/83; 327/109
(58) Field of Classification Search ............... 323/284, 323/282; 326/83, 87; 327/109, 112
See application file for complete search history.

(56) References Cited

U.S. PATENT DOCUMENTS

| | | | |
|---|---|---|---|
| 4,016,461 A | 4/1977 | Roland | |
| 4,654,770 A | 3/1987 | Santurtûn et al. | |
| 4,761,725 A | 8/1988 | Henze | |
| 4,801,816 A | 1/1989 | Merlo et al. | |
| 4,912,622 A | 3/1990 | Steigerwald et al. | |
| 4,982,353 A | 1/1991 | Jacob et al. | |
| 5,245,228 A | 9/1993 | Harter | |
| 5,258,662 A | 11/1993 | Skovmand | |
| 5,285,369 A | 2/1994 | Balakrishnan | |
| 5,371,415 A | 12/1994 | Dixon et al. | |
| 5,414,341 A | 5/1995 | Brown | |
| 5,469,334 A | 11/1995 | Balakrishnan | |
| 5,510,739 A * | 4/1996 | Caravella et al. | 327/112 |
| 5,541,541 A * | 7/1996 | Salamina et al. | 327/108 |
| 5,548,206 A | 8/1996 | Soo | |
| 5,568,044 A | 10/1996 | Bittner | |
| 5,592,072 A | 1/1997 | Brown | |
| 5,594,324 A | 1/1997 | Canter et al. | |
| 5,625,312 A * | 4/1997 | Kawakami et al. | 327/483 |
| 5,689,213 A | 11/1997 | Sher | |
| 5,796,276 A | 8/1998 | Phillips et al. | |
| 5,864,225 A | 1/1999 | Bryson | |
| 5,877,611 A | 3/1999 | Brkovic | |
| 5,912,589 A | 6/1999 | Khoury et al. | |
| 5,977,811 A | 11/1999 | Magazzú | |
| 6,005,377 A | 12/1999 | Chen et al. | |
| 6,118,351 A | 9/2000 | Kossives et al. | |
| 6,169,433 B1 | 1/2001 | Farrenkopf | |

(Continued)

OTHER PUBLICATIONS

Barrado, A., et al., "New DC/DC Converter with Low Output Voltage and Fast Transient Response," Proceedings of the IEEE Applied Power Electronics Conference, 2003, pp. 432-437, IEEE, Los Alamitos, CA.

(Continued)

*Primary Examiner*—Harry Behm
(74) *Attorney, Agent, or Firm*—Slater & Matsil, L.L.P.

(57) ABSTRACT

A driver for a switch, a related method of driving the switch, and a power converter employing the same. In one embodiment, the driver includes switching circuitry having a driver switch referenced to a voltage level and configured to provide a drive signal to a control terminal of a power switch referenced to another voltage level and subject to a control voltage limit. The driver also includes a comparator configured to change a state of the driver switch when a voltage at the control terminal passes a threshold voltage.

20 Claims, 8 Drawing Sheets

U.S. PATENT DOCUMENTS

| | | |
|---|---|---|
| 6,201,429 B1 | 3/2001 | Rosenthal |
| 6,211,706 B1 | 4/2001 | Choi et al. |
| 6,222,403 B1 * | 4/2001 | Mitsuda .................. 327/170 |
| 6,255,714 B1 | 7/2001 | Kossives et al. |
| 6,262,564 B1 | 7/2001 | Kanamori |
| 6,285,209 B1 * | 9/2001 | Sawai ..................... 326/34 |
| 6,285,539 B1 | 9/2001 | Kashimoto et al. |
| 6,320,449 B1 | 11/2001 | Capici et al. |
| 6,388,468 B1 | 5/2002 | Li |
| 6,407,579 B1 | 6/2002 | Goswick |
| 6,407,594 B1 | 6/2002 | Milazzo et al. |
| 6,452,368 B1 | 9/2002 | Basso et al. |
| 6,477,065 B2 | 11/2002 | Parks |
| 6,495,019 B1 | 12/2002 | Filas et al. |
| 6,541,819 B2 | 4/2003 | Lotfi et al. |
| 6,570,413 B1 * | 5/2003 | Kumagai et al. ............ 327/108 |
| 6,573,694 B2 | 6/2003 | Pulkin et al. |
| 6,580,258 B2 | 6/2003 | Wilcox et al. |
| 6,639,427 B2 | 10/2003 | Dray et al. |
| 6,650,169 B2 | 11/2003 | Faye et al. |
| 6,661,216 B1 | 12/2003 | Grant et al. |
| 6,759,836 B1 | 7/2004 | Black, Jr. |
| 6,791,305 B2 | 9/2004 | Imai et al. |
| 6,822,882 B1 | 11/2004 | Jacobs et al. |
| 6,828,825 B2 | 12/2004 | Johnson et al. |
| 6,879,137 B2 | 4/2005 | Sase et al. |
| 6,922,044 B2 | 7/2005 | Walters et al. |
| 6,984,968 B2 | 1/2006 | Moon |
| 7,015,544 B2 | 3/2006 | Lotfi et al. |
| 7,019,505 B2 | 3/2006 | Dwarakanath et al. |
| 7,038,438 B2 | 5/2006 | Dwarakanath et al. |
| 7,038,514 B2 | 5/2006 | Leith et al. |
| 7,061,217 B2 * | 6/2006 | Bayer et al. ................ 323/284 |
| 7,148,670 B2 | 12/2006 | Inn et al. |
| 7,190,150 B2 | 3/2007 | Chen et al. |
| 7,214,985 B2 | 5/2007 | Lotfi et al. |
| 7,230,302 B2 | 6/2007 | Lotfi et al. |
| 7,319,311 B2 | 1/2008 | Nishida |
| 7,330,017 B2 | 2/2008 | Dwarakanath et al. |
| 7,352,162 B1 | 4/2008 | Chang et al. |
| 7,482,795 B2 | 1/2009 | Parto et al. |
| 7,482,796 B2 | 1/2009 | Nishida |
| 7,501,805 B2 | 3/2009 | Chen et al. |
| 7,521,907 B2 | 4/2009 | Cervera et al. |
| 7,710,093 B2 | 5/2010 | Dwarakanath et al. |
| 7,714,558 B2 | 5/2010 | Wu |
| 7,728,573 B2 | 6/2010 | Capilla et al. |
| 7,733,072 B2 | 6/2010 | Kanakubo |
| 2002/0175661 A1 | 11/2002 | Wheeler et al. |
| 2004/0169498 A1 | 9/2004 | Goder et al. |
| 2005/0046405 A1 | 3/2005 | Trafton et al. |
| 2005/0088216 A1 * | 4/2005 | Arndt et al. ................ 327/325 |
| 2005/0167756 A1 | 8/2005 | Lotfi et al. |
| 2005/0168203 A1 | 8/2005 | Dwarakanath et al. |
| 2005/0168205 A1 | 8/2005 | Dwarakanath et al. |
| 2005/0169024 A1 | 8/2005 | Dwarakanath et al. |
| 2006/0038225 A1 | 2/2006 | Lotfi et al. |
| 2006/0132217 A1 | 6/2006 | Lou et al. |
| 2007/0210777 A1 | 9/2007 | Cervera et al. |
| 2008/0094114 A1 | 4/2008 | Dwarakanath et al. |
| 2008/0106246 A1 | 5/2008 | Dwarakanath et al. |

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

Goder, D., et al., "V2 Architecture Provides Ultra-Fast Transient Response in Switch Mode Power Supplies," Proceedings of HFPC Power Conversion, 1996, pp. 414-420.

Goodman, J. et al., "An Energy/Security Scalable Encryption Processor Using an Embedded Variable Voltage DC/DC Converter," IEEE Journal of Solid-State Circuits, Nov. 1998, vol. 33, No. 11, IEEE, Los Alamitos, CA.

Horowitz, P., et al., "The Art of Electronics," Second Edition, 1989, pp. 288-291, Cambridge University Press, Cambridge, MA.

"Linear Technology: LTC3736-1: Dual 2-Phase, No RSENSETM, Synchronous Controller with Spread Spectrum," 2004, 28 pp., Linear Technology Corporation, Milpitas, CA.

Lotfi, A.W., et al., "Issues and Advances in High-Frequency Magnetics for Switching Power Supplies," Proceedings of the IEEE, Jun. 2001, vol. 89, No. 6, pp. 833-845, IEEE, Los Alamitos, CA.

Patella, B.J., et al.,"High-Frequency Digital Controller IC for DC/DC Converters," IEEE Proceedings of the Applied Power Electronics Conference, Mar. 10, 2002, 7 pp., IEEE, Los Alamitos, CA.

Peterchev, A.V., et al., "Quantization Resolution and Limit Cycling in Digitally Controlled PWM Converters," IEEE Transactions on Power Electronics, Jan. 2003, pp. 301-303, vol. 18, No. 1, IEEE, Los Alamitos, CA.

Redl, R., et al., "Optimizing the Load Transient Response of the Buck Converter," Proceedings of the IEEE Applied Power Electronics Conference, 1998, pp. 170-176, IEEE, Los Alamitos, CA.

Schoneman, G.K., et al., "Output Impedance Considerations for Switching Regulators with Current-Injected Control," Proceedings of the 18th Annual IEEE Power Electronics Specialists Conference, Jun. 1987, pp. 324-335, IEEE, Los Alamitos, CA.

Soto, A., et al. "Analysis of the Buck Converter for Scaling the Supply Voltage of Digital Circuits," Proceedings of the IEEE Applied Power Electronics Conference, 2003, pp. 711-717, IEEE, Los Alamitos, CA.

Soto, A., et al., "Design Methodology for Dynamic Voltage Scaling in the Buck Converter," Proceedings of the IEEE Applied Power Electronics Conference, 2005, pp. 263-269, IEEE, Los Alamitos, CA.

"TPS40100: Midrange Input Synchronous Buck Controller with Advanced Sequencing and Output Margining," May 2005, 37 pp., Texas Instruments Incorporated, Dallas, TX.

Zhou, X., et al., "Improved Light-Load Efficiency for Synchronous Rectifier Voltage Regulation Module," IEEE Transactions on Power Electronics, Sep. 2000, pp. 826-834, vol. 15, No. 5, IEEE, Los Alamitos, CA.

* cited by examiner

DRIVER FOR SWITCH AND A METHOD OF DRIVING THE SAME

TECHNICAL FIELD

The present invention is directed, in general, to power electronics and, more specifically, to a driver for a switch, method of driving the same, and a power converter employing the same.

BACKGROUND

A switch mode power converter (also referred to as a "power converter") is a power supply or power processing circuit that converts an input voltage waveform into a specified output voltage waveform. Controllers associated with the power converter manage an operation thereof by controlling the conduction periods of switches employed therein. Generally, controllers are coupled between an input and output of the power converter in a feedback loop configuration (also referred to as a "control loop" or "closed control loop").

Typically, the controller measures an output characteristic (e.g., an output voltage) of the power converter and based thereon modifies a duty cycle of the switches of the power converter. The duty cycle is a ratio represented by a conduction period of a switch to a switching period thereof. Thus, if a switch conducts for half of the switching period, the duty cycle for the switch would be 0.5 (or 50 percent). Additionally, as the needs for systems such as a microprocessor powered by the power converter dynamically change (e.g., as a computational load on the microprocessor changes), the controller should be configured to dynamically increase or decrease the duty cycle of the switches therein to maintain the output characteristic at a desired value.

In combination with a controller, a driver is often employed to provide a drive signal to the switches of the power converter as a function of a signal from the controller. Assuming without limitation that the switches of the power converter are metal-oxide semiconductor field-effect transistors ("MOSFETs"), the driver is referred to as a gate driver and provides a gate drive signal (i.e., a drive signal) to a gate terminal (i.e., a control terminal) of the MOSFET to control an operation thereof. Providing a gate drive signal with a limited control voltage range (or "gate voltage limit") for a MOSFET is of particular interest in the design and implementation of power converters. In an exemplary application, the power converters have the capability to convert an unregulated input voltage, such as five volts, to a lower, regulated, output voltage, such as 2.5 volts, to power a load.

As discussed above, power converters are frequently employed to power loads having tight regulation characteristics such as a microprocessor with, for instance, five volts provided from a source of electrical power (e.g., a voltage source). To provide the voltage conversion and regulation functions, the power converters include active switches such as the MOSFETs that are coupled to the voltage source and periodically switch a reactive circuit element such as an inductor to the voltage source at a switching frequency that may be on the order of ten megahertz. To maintain high power conversion efficiency and low cost, the MOSFETs employed for the switches in the power converters are generally configured with fine line structures and thin gate oxides. The aforementioned structures that form the MOSFETs, however, present new design challenges associated with maintaining voltage limits of the control signals such as a gate voltage adapted to control the conduction periods of the switches.

For instance, recently designed MOSFETs for the power converters can reliably sustain control signals of no more than, for instance, about 2.5 volts from the gate terminal to the source terminal, whereas MOSFETs of earlier designs were able to sustain control signals of 20 volts or more. Additionally, the power converters often employ a P-channel MOSFET as a main power switch therein. Inasmuch as the P-channel MOSFET is generally coupled to the input voltage source (e.g., nominal five volts) of the power converter, the gate voltage is desirably controlled to a value of the input voltage (again, five volts) supplied by the input voltage source to transition the switch to a non-conducting state. Conversely, the P-channel MOSFET is enabled to conduct at a gate voltage equal to the input voltage of five volts minus 2.5 volts, which represents about the maximum sustainable voltage from the gate terminal to the source terminal of the switch (also referred to as a "gate-to-source voltage limit" or a "gate voltage limit" of the switch).

It is common to employ a driver for a P-channel MOSFET that includes a series-coupled, totem-pole arrangement of a P-channel and N-channel MOSFET with coupled gate terminals. In the environment of a power converter, the totem pole driver (as the driver is customarily designated) for the P-channel MOSFET is coupled to a positive source of electrical power for the power converter and to the controller of the power converter. The drive signal for the gate of a P-channel MOSFET is generated from a junction coupling the drain terminals of the P-channel and N-channel MOSFETs of the totem pole driver. When a signal from the controller to the totem pole driver is high, the drive signal is essentially grounded. When the signal from the controller to the totem pole driver is low, the drive signal is substantially equal to the input voltage of the power converter. In effect, the drive signal from the totem pole driver exhibits voltages over the entire voltage range of the source of electrical power for the power converter, which can exceed the allowable voltage range of the gate of the driven switch, which may be limited to 2.5 volts from its source terminal, as described above. Alternatively, the driver may be described as providing a drive signal referenced to ground when its output is low, and a drive signal referenced to the input voltage when its output is high, thereby exceeding the voltage range of the gate of the driven switch.

Thus, when providing a drive signal to a P-channel MOSFET (or any switch for that matter, such as an N-channel MOSFET) having a gate voltage limit of 2.5 volts, and in the environment of a power converter for example, having a nominal input voltage of five volts, the extended voltage range present on the gate terminal of the switch may break down the integrity of the thin gate oxide of the switch. In other words, when the input voltage to the power converter which is translated into the drive signal to the switch under certain conditions as described above exceeds the gate voltage limit thereof, the switch may be damaged and fail. Thus, the totem pole driver and other presently available drivers are typically not practical without circuit modifications for applications wherein the switch to be driven exhibits a smaller gate voltage limit than the input voltage of the power converter from the gate terminal to the source terminal thereof.

Another level of complexity arises when the switch to be driven and the driver are referenced to different voltages. In the environment of the power converter described above, circuitry that embodies the driver may be coupled to ground and referenced to a ground potential and the switch to be driven may be referenced to, for instance, the input voltage of the power converter. As a result, the driver is referenced to a ground potential and the switch is referenced to an input voltage such as an unregulated five volt input voltage. Thus, in conjunction with the control voltage limit, the driver should be adapted to drive a switch referenced to another voltage level as described above and adaptively perform the necessary voltage translation to the another voltage level to provide the drive signal.

There have been attempts to meet the voltage limitations of a switch as described above. Generally, an intermediate bus voltage is established for a driver and by-passed to a reference potential such as ground with substantial added capacitance. Additionally, a level-shifting capacitor may be added in conjunction with the driver to provide a voltage translation function therefor. The addition of a capacitor to a controller with the driver (which is generally formed as an integrated circuit) usually requires the addition of two conductive "pads" to accommodate an external capacitor interconnection, which consumes substantial die area, or the substantial space required for an integrated capacitor. Thus, drivers for applications employing switches with a control voltage limit (i.e., a control voltage substantially less than an input voltage of the power converter) are often allocated space that is not easily integrable with the rest of the integrated circuit. Consequently, controllers with such drivers add measurable cost to a design of a power converter beyond the voltage sourcing functionality thereof.

Accordingly, what is needed in the art is a driver, and a method of driving a switch, that takes into account a control voltage limit associated with a switch (e.g., a gate voltage limit for a MOSFET) referenced to a voltage level different from the driver, that overcomes the deficiencies in the prior art.

SUMMARY OF THE INVENTION

These and other problems are generally solved or circumvented, and technical advantages are generally achieved, by advantageous embodiments of a driver for a switch, a related method of driving the switch, and a power converter employing the same. In one embodiment, the driver includes switching circuitry having a driver switch referenced to a voltage level and configured to provide a drive signal to a control terminal of a power switch referenced to another voltage level and subject to a control voltage limit. The driver also includes a comparator configured to change a state of the driver switch when a voltage at the control terminal passes a threshold voltage.

In another aspect, the present invention provides a power converter couplable to a source of electrical power adapted to provide an input voltage thereto. In one embodiment, the power converter includes a power train including a power switch, referenced to the input voltage and subject to a control voltage limit, configured to conduct for a duty cycle and provide a regulated output characteristic at an output of the power converter. The power converter also includes a controller configured to provide a signal to control a duty cycle of the power switch and a driver configured to provide a drive signal as a function of said signal to control the duty cycle of the power switch. The driver includes switching circuitry having a driver switch referenced to a voltage level different from the input voltage level and configured to provide the drive signal to a control terminal of the power switch. The driver also includes a comparator configured to change a state of the driver switch when a voltage at the control terminal passes a threshold voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated, and may not be redescribed after the first instance in the interest of brevity. The figures are drawn to clearly illustrate the relevant aspects of the preferred embodiments.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a driver for a power converter, method of driving a switch thereof and a power converter employing the same. The principles of the present invention, however, may also be applied to all types of power supplies employing various conversion topologies that may benefit from a driver that takes into account a control voltage limit associated with a switch [e.g., the gate voltage limit for a metal-oxide semiconductor field-effect transistor ("MOSFET")] of the power converter referenced to a voltage level different from the driver.

In accordance therewith, the present invention provides a driver having switching circuitry with a driver switch referenced to a voltage level and configured to provide a drive signal for a power switch referenced to another voltage level and subject to a control voltage limit. In a related, but alternative embodiment, the driver is employable with a power converter couplable to a source of electrical power adapted to provide an input voltage thereto. The power converter includes a power train having a power switch referenced to the input voltage and subject to a control voltage limit. The driver includes switching circuitry with a driver switch referenced to a voltage level different from the input voltage and configured to provide a drive signal for the power switch within the control voltage limit thereof. For instance, the power switch may be a MOSFET having a gate terminal and a source terminal referenced to the input voltage of the power converter. Of course, other types of switches may be used for the power switch such as insulated-gate bipolar transistors. The switching circuitry is configured therein to provide a gate drive signal for the MOSFET within a gate voltage limit thereof.

In an exemplary embodiment, the driver (referenced to a voltage level such as ground) includes a comparator and controls a voltage applied to a control terminal of the power switch such as a turn-on voltage for a P-channel MOSFET ("PMOS") switch that is referenced to another voltage level such as a voltage of a source of electrical power (e.g., a PMOS switch that has its source coupled to an ungrounded node of the source of electrical power). One input of the comparator is coupled to a control terminal of the power switch and another input of the comparator is coupled to a reference voltage. The comparator changes a state of a driver switch therein in response to a voltage at the control terminal of the power switch passing a threshold voltage. The comparator thereby controls the drive signal for the power switch within a control voltage limit thereof. Additionally, the driver may include a logic gate(s) interposed between an output terminal of the comparator and the power switch. A logic gate(s) may be included in the driver to prevent a shoot-through current in a series circuit arrangement of two power switches controlled by the driver.

In another aspect and for use with a power converter couplable to a source of electrical power adapted to provide an input voltage thereto, the present invention provides a method of driving a power switch of the power converter referenced to the input voltage (such as an ungrounded node of the source of electrical power), and subject to a control voltage limit. The method includes providing a drive signal for the power switch within the control voltage limit of the power switch with switching circuitry referenced to a voltage level different from the input voltage (such as ground). In a preferred embodiment, the method includes providing a drive signal for the power switch in response to a voltage of the control terminal of the power switch crossing a threshold voltage. The switching circuitry may include a plurality of driver switches wherein one or more of the plurality of driver switches are couplable to ground. In accordance therewith, ones of the plurality of driver switches are configured to cooperate to provide the drive signal to the power switch. Additionally, the switching circuitry may include at least one driver switch configured to enable a mode of operation wherein the drive signal for the power switch is referenced to the voltage level of the switching circuitry. Further, a signal may be provided to the switching circuitry, which is a complement of the signal to control a duty cycle of the power switch.

In yet another aspect, the present invention provides a power converter couplable to a source of electrical power adapted to provide an input voltage thereto. The power converter includes a power train including a power switch referenced to the input voltage and subject to a control voltage limit. The power switch is configured to conduct for a duty cycle and provide a regulated output characteristic at an output of the power converter. The power converter also includes a controller configured to provide a signal to control the duty cycle of the power switch. The power converter still further includes a driver including switching circuitry and configured to provide a drive signal for the power switch within the control voltage limit as a function of the signal from the controller. In a preferred embodiment, the driver provides a drive signal for the power switch in response to a voltage of the control terminal of the power switch crossing a threshold voltage. Additionally, the controller may provide a complement of the signal to control the duty cycle of the power switch. In accordance therewith, the driver is configured to provide the drive signal for the power switch within the control voltage limit as a function of the complement of the signal from the controller.

Figure 1:
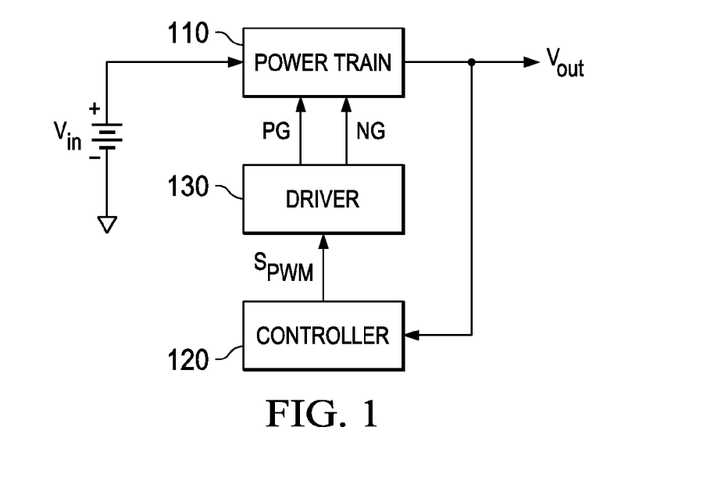
FIG. 1 illustrates a block diagram of an embodiment of a power converter constructed according to the principles of the present invention.

Referring initially to FIG. 1, illustrated is a block diagram of an embodiment of a power converter constructed according to the principles of the present invention. The power converter includes a power train 110 coupled to a source of electrical power (represented by a battery) for providing an input voltage $V_{in}$ for the power converter. The power converter also includes a controller 120 and a driver 130, and provides power to a system (not shown) such as a microprocessor coupled to an output thereof. The power train 110 may employ a buck converter topology as illustrated and described with respect to FIG. 2 below. Of course, any number of converter topologies may benefit from the use of a driver 130 constructed according to the principles of the present invention and are well within the broad scope of the present invention.

The power train 110 receives an input voltage $V_{in}$ at an input thereof and provides a regulated output characteristic (e.g., an output voltage $V_{out}$) to power a microprocessor or other load coupled to an output of the power converter. The controller 120 may be coupled to a voltage reference representing a desired characteristic such as a desired system voltage from an internal or external source associated with the microprocessor, and to the output voltage $V_{out}$ of the power converter. In accordance with the aforementioned characteristics, the controller 120 provides a signal $S_{PWM}$ to control a duty cycle and a frequency of at least one power switch of the power train 110 to regulate the output voltage $V_{out}$ or another characteristic thereof.

In accordance with the aforementioned characteristics, a drive signal(s) [e.g., a first gate drive signal PG with duty cycle D functional for a P-channel MOSFET ("PMOS") power switch and a second gate drive signal NG with complementary duty cycle 1-D functional for an N-channel MOSFET ("NMOS") power switch] is provided by the driver 130 to control a duty cycle and a frequency of one or more power switches of the power converter, preferably to regulate the output voltage $V_{OUT}$ thereof. For a PMOS power switch or PMOS switch, a gate drive signal is typically driven negative to turn on the PMOS switch, and for an NMOS power switch or NMOS switch, a gate drive signal is typically driven positive to turn on the NMOS switch.

As will become more apparent, the driver 130 is particularly adapted to take into account a control voltage limit associated with a power switch of the power converter. Moreover, the driver 130 resolves a challenge wherein portions of the circuitry thereof is referenced to a voltage level and the power switch(es) of the power train 110 to be driven is referenced to another voltage level. Additionally, the driver 130 may employ techniques to provide sufficient signal delays to prevent crosscurrents when controlling multiple power switches in the power converter.

Figure 2:
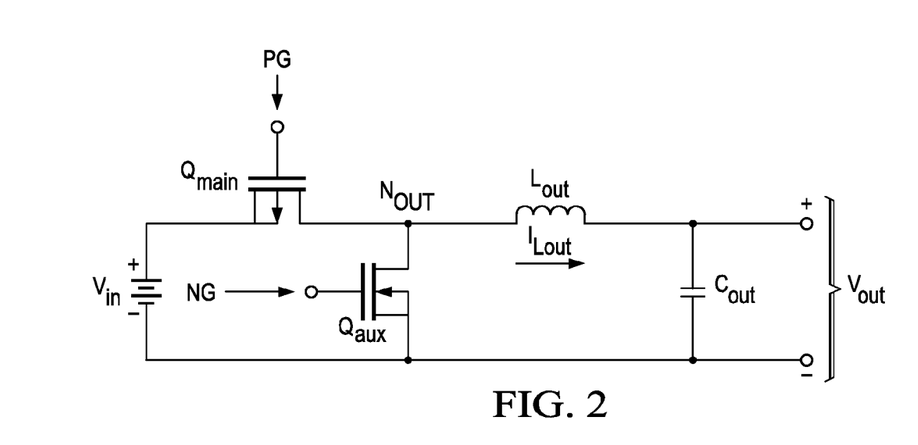
FIG. 2 illustrates a schematic diagram of an embodiment of a power train of a power converter constructed according to the principles of the present invention.

Turning now to FIG. 2, illustrated is a schematic diagram of an embodiment of a power train of a power converter constructed according to the principles of the present invention. While in the illustrated embodiment the power train employs a buck converter topology, those skilled in the art should understand that other converter topologies such as a forward converter topology or an active clamp topology are well within the broad scope of the present invention.

The power train of the power converter receives an input voltage $V_{in}$ (e.g., an unregulated input voltage) from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main power switch $Q_{main}$, (e.g., a PMOS switch) is enabled to conduct by a gate drive signal PG for a primary interval (generally co-existent with a duty cycle "D" of the main power switch $Q_{main}$,) and couples the input voltage $V_{in}$ to an output filter inductor $L_{out}$ at a node (generally designated $N_{OUT}$). During the primary interval, an inductor current $I_{Lout}$ flowing through the output filter inductor $L_{out}$ increases as a current flows from the input to the output of the power train. An ac component of the inductor current $I_{Lout}$ is filtered by an output capacitor $C_{out}$.

During a complementary interval (generally co-existent with a complementary duty cycle "1-D" of the main power switch $Q_{main}$), the main power switch $Q_{main}$ is transitioned to a non-conducting state and an auxiliary power switch $Q_{aux}$ (e.g., an NMOS switch) is enabled to conduct by a gate drive signal NG. The auxiliary power switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary power switches $Q_{main}$, $Q_{aux}$ may be adjusted to maintain a regulation of the output voltage $V_{OUT}$ of the power converter. Those skilled in the art should understand, however, that the conduction periods for the main and auxiliary power switches $Q_{main}$, $Q_{aux}$ may be separated by a small time interval to avoid cross conduction therebetween and beneficially to reduce the switching losses associated with the power converter.

As described above, the main and auxiliary power switches $Q_{main}$, $Q_{aux}$, in the illustrated embodiment, are embodied in PMOS and NMOS switches, respectively. Due to the design of the main power switch $Q_{main}$, and operating conditions of the power converter, a driver employable to provide a gate drive signal to control, for instance, the main power switch $Q_{main}$ is subject to design challenges that a driver according to the present invention is adapted to address.

In accordance with the aforementioned FIGUREs, an example of controllers employing digital circuitry, see U.S. Pat. No. 7,038,438, entitled "Controller for a Power Converter and a Method of Controlling a Switch Thereof," to Dwarakanath, et al. and U.S. Patent Application Publication No. 2005/0168205, entitled "Controller for a Power Converter and Method of Controlling a Switch Thereof," to Dwarakanath, et al., an exemplary driver, see U.S. Patent Application Publication No. 2005/0168203, entitled "Driver for a Power Converter and Method of Driving a Switch Thereof," to Dwarakanath, et al., and an exemplary semiconductor device employable as a switch, see U.S. Patent Application Publication No. 2005/0167756, entitled "Laterally Diffused Metal Oxide Semiconductor Device and Method of Forming the Same," to Lotfi, et al., which are incorporated herein by reference. Prior to introducing a driver according to the present invention, a conventional driver and the limitations associated therewith are hereinafter described.

Figure 3:
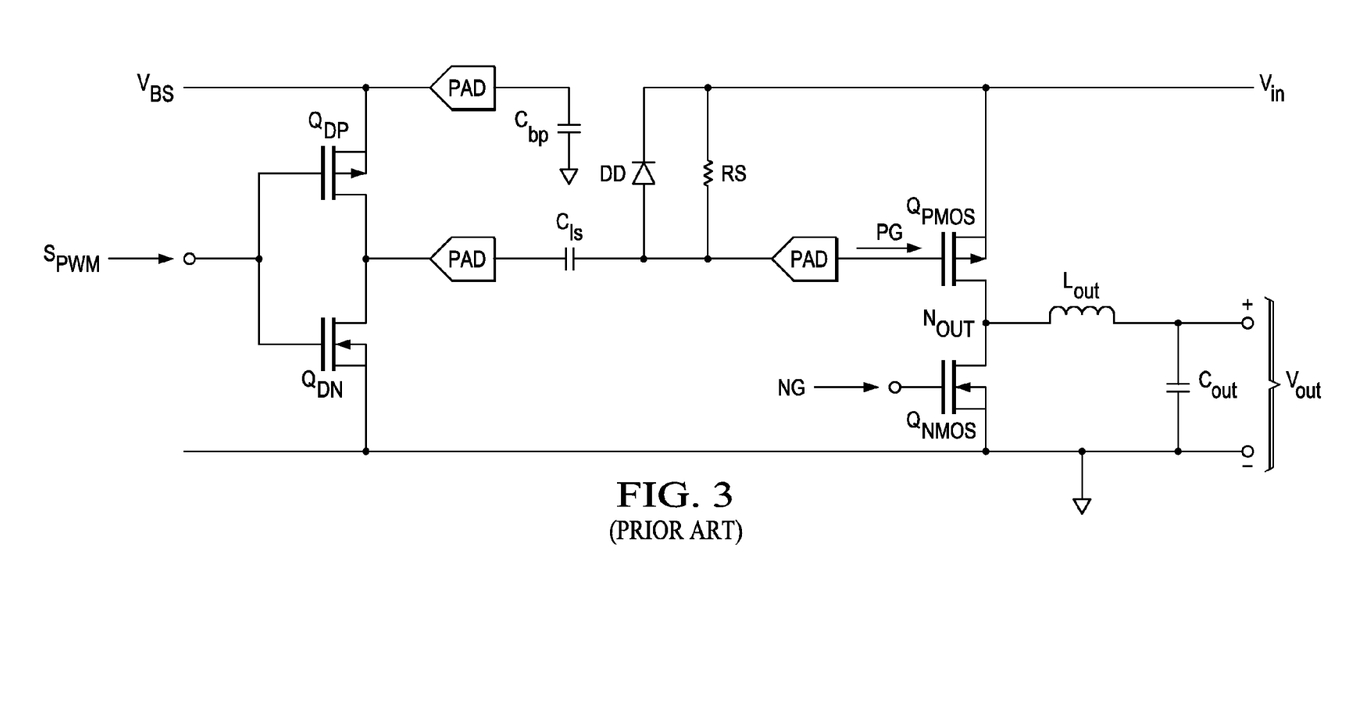
FIG. 3 illustrates a schematic diagram of a driver for a P-channel metal-oxide semiconductor field-effect transistor power switch according to the prior art.

Turning now to FIG. 3, illustrated is a schematic diagram of a driver for a PMOS power switch according to the prior art. The driver receives a signal $S_{PWM}$, which is a duty cycle signal, from a controller and the signal $S_{PWM}$ is high for a complementary duty cycle 1-D of a switching cycle. The driver includes PMOS and NMOS driver switches $Q_{DP}$, $Q_{DN}$ for a power switch (in this case, a PMOS power switch $Q_{PMOS}$) referenced to an input voltage $V_{in}$ operates from a bias voltage $V_{BS}$. The driver employs a level-shift capacitor $C_{ls}$, typically about a five nanofarad ("nF") ceramic, surface-mount capacitor, to stiffen the voltage source, and a dc restoration circuit including a resistor RS and the diode DD to establish an off-drive condition for a gate drive signal PG for the PMOS power switch $Q_{PMOS}$.

Accommodation in the design of the driver for a non-ideal forward-drop voltage characteristics of the diode DD can be readily made. A peak-to-peak drive voltage level is essentially set by the bias voltage $V_{BS}$. During turn off of the PMOS power switch $Q_{PMOS}$ (i.e., when the gate voltage is pulled up), a large charging current is drawn from the bias voltage $V_{BS}$. The implementation of the driver requires a pair of pads (designated PAD) about the level-shifting capacitor $C_{ls}$ and a bypass capacitor $C_{bp}$ [with its associated pad (also designated PAD)] proximate the bias voltage $V_{BS}$, to hold the voltage with respect to ground. Each pad requires allocation of a substantial area in an integrated circuit embodying the driver as a part of a power converter and the capacitors also require substantial additional area for the respective mounting arrangement. Thus, the driver, while producing an accurately controlled gate drive signal for the PMOS power switch $Q_{PMOS}$, also requires allocation of substantial die area in an integrated circuit that adversely affects die size and cost. In the interest of brevity, analogous elements and corresponding signals from previous illustrations of the power converter in this and following FIGUREs will not herein be provided.

Figure 4:
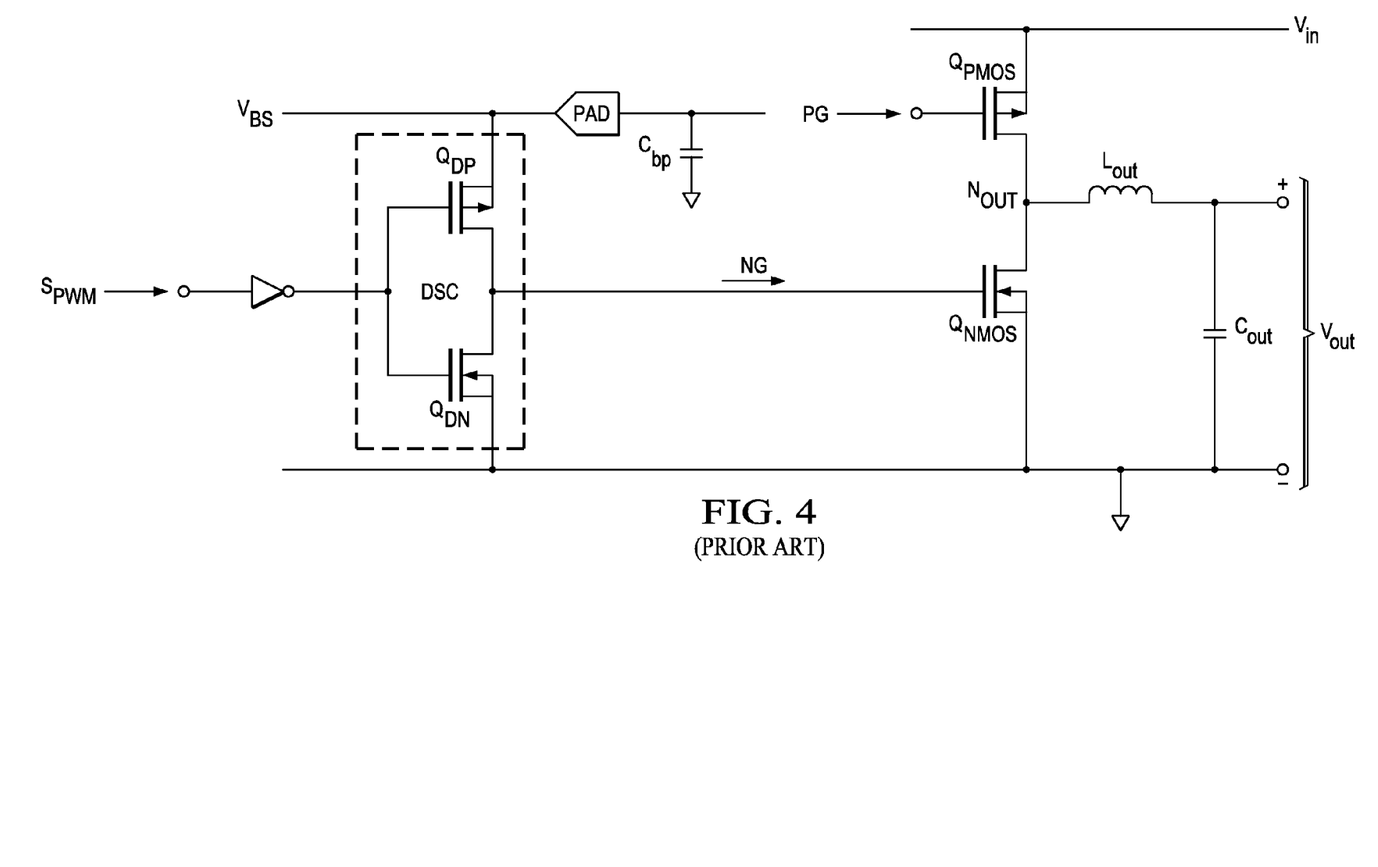
FIG. 4 illustrates a schematic diagram of a driver for an N-channel metal-oxide semiconductor field-effect transistor power switch according to the prior art.

Turning now to FIG. 4, illustrated is a schematic diagram of a driver for an NMOS power switch according to the prior art. The driver receives a signal $S_{PWM}$, which is a duty cycle signal, from a controller, and the signal $S_{PWM}$ is high for a complementary duty cycle 1-D of a switching cycle. A complement of the signal $S_{PWM}$ is provided by an inverter (generally designated "INV") such that the inverted signal is high for a duty cycle D of a switching cycle.

If the complement of the signal $S_{PWM}$ is available, the inverter INV can be omitted. The driver includes PMOS and NMOS driver switches $Q_{DP}$, $Q_{DN}$ that produce a gate drive signal NG for a power switch (in this case, an NMOS power switch $Q_{NMOS}$). The driver is powered from a bias voltage $V_{BS}$, which uses a bypass capacitor $C_{bp}$ with the respective pad (designated "PAD") to hold the bias voltage $V_{BS}$ with respect to a ground. The NMOS driver switch $Q_{DN}$ must have sufficiently low on-resistance to discharge the gate of the NMOS power switch $Q_{NMOS}$ rapidly, and to hold the gate drive signal NG at ground potential during a positive voltage slew at a node $N_{OUT}$, absorbing current associated with charging the gate-to-drain capacitance of the NMOS power switch $Q_{NMOS}$. During positive charging of the gate drive signal NG, substantial current is drawn from a rail associated with the bias voltage $V_{BS}$.

Thus, drivers of the prior art generally require two capacitors and their associated integrated circuit mounting pads with previously described disadvantages. Conversely, a driver according to the present invention may employ separate pull-up and pull-down drivers for each control terminal (e.g., a gate terminal) of the power switch that pull the large gate charging currents from ground or from an input voltage of a power converter. A design issue is to provide an adequate gate drive signal for the power switches exhibiting high gate capacitance, while ensuring that the gate drive signal does not exceed a gate drive voltage limit, which can cause damage. The latter issue applies to any signals transferred between various voltage-referenced domains of a power converter or any other circuit, for that matter.

Figure 5:
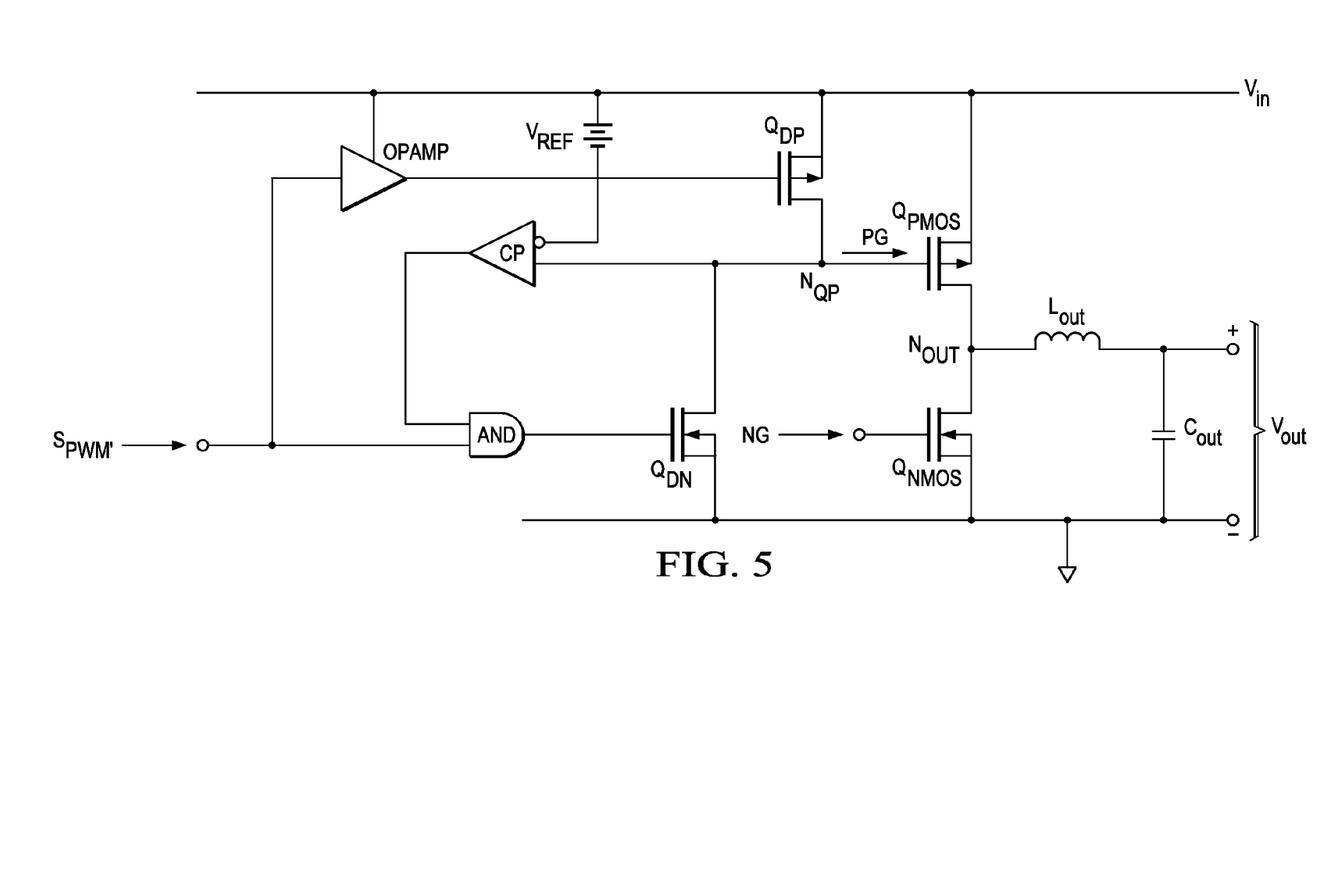
FIG. 5 illustrates a schematic diagram of an embodiment of a driver for a P-channel metal-oxide semiconductor field-effect transistor power switch according to the principles of the present invention.

Turning now to FIG. 5, illustrated is a schematic diagram of an embodiment of a driver for a PMOS power switch according to the principles of the present invention. The driver provides an adequate drive signal while eliminating the need for coupling capacitors and the large currents associated with a bias voltage. The driver also eliminates the need to create an intermediate bias voltage with the corresponding bypass and level-shifting capacitors (and the associated pads) as described above.

The driver provides a gate drive signal PG for a power switch (e.g., a PMOS power switch $Q_{PMOS}$) that is high (i.e., substantially equal to an input voltage $V_{in}$) that turns off the PMOS power switch $Q_{PMOS}$ when a signal (e.g., a signal $S_{PWM}$, which is a complement of a signal $S_{PWM}$ from a controller as described above) is low (i.e., substantially equal to a ground voltage potential). When the signal $S_{PWM}$ is high, a node $N_{QP}$ is below (e.g., about 2.5 volts below) the input voltage $V_{in}$, thereby substantially enabling the PMOS power switch $Q_{PMOS}$ to conduct.

An exemplary operation for the driver will hereinafter be described. When the signal $S_{PWM}$ is high, an operational amplifier and level translator (generally designated "OPAMP") references the signal $S_{PWM}$ to the input voltage $V_{in}$ thereby raising a gate voltage and turning off a PMOS driver switch $Q_{DP}$. It is assumed herein that the gate voltage of the PMOS power switch $Q_{PMOS}$ has been previously controlled to be about 2.5 volts below the input voltage $V_{in}$. Thus, the output of a comparator (generally designated "CP") is low and, accordingly, the output of an AND gate (generally referred to as "AND") is low and the gate of the PMOS power switch $Q_{PMOS}$ will remain at a substantially stationary voltage by the charge on its gate capacitance, allowing the PMOS power switch $Q_{PMOS}$ to substantially conduct. When the signal $S_{PWM}$ goes low, the output of the operational amplifier and level translator OPAMP also goes low, turning on the PMOS driver switch $Q_{DP}$. The aforementioned action quickly pulls the gate of the PMOS power switch $Q_{PMOS}$ to the input voltage $V_{in}$ thereby turning off the PMOS power switch $Q_{PMOS}$ and shifting the output of the comparator CP to a high state.

When the signal $S_{PWM}$ goes high, the AND gate also goes high, thereby turning on NMOS driver switch $Q_{DN}$. The NMOS driver switch $Q_{DN}$ begins to pull down the gate of the PMOS power switch $Q_{PMOS}$, charging its gate capacitance. When the voltage of the gate of PMOS power switch $Q_{PMOS}$ passes a threshold voltage (e.g., falls below about 2.4 volts less than the input voltage $V_{in}$), the output of comparator CP goes low, causing the output of the AND gate to go low, thereby disabling the NMOS driver switch $Q_{DN}$. Thus, the voltage of the gate of the PMOS power switch $Q_{PMOS}$ is pulled down to the correct voltage level to enable it to substantially fully conduct, without the need for an intermediate bus voltage, and without a bypass capacitor that is necessary in circuits of the prior art.

Thus, the NMOS driver switch $Q_{DN}$ is referenced to a voltage level (e.g., ground) and is configured to provide a gate drive signal PG to a gate terminal of the PMOS power switch $Q_{PMOS}$ referenced to another voltage level (e.g., the input voltage $V_{in}$) and subject to a control voltage limit (e.g., five volts). A comparator CP of the driver is configured to change a state of the NMOS driver switch $Q_{DN}$ when a voltage at the gate terminal of the PMOS power switch $Q_{PMOS}$ passes a threshold voltage (e.g., the input voltage $V_{in}$ minus the reference voltage $V_{REF}$).

An internal voltage reference $V_{REF}$ such as the 2.4 volt reference coupled to the source of the input voltage $V_{in}$ (illustrated in FIG. 5 as a battery) may be implemented within integrated circuits, and the reference voltage can be selected to accommodate predictable delays inherent in logic gates, comparators, and operational amplifiers. The voltage reference need not be precise, as a power switch can generally be enabled to substantially fully conduct with an imprecise gate voltage. The circuit illustrated in FIG. 5 advantageously uses the rapid response time of presently available logic gates and comparators, which can be on the order of a nanosecond or less, to terminate charging a gate of a power switch. For instance, the gate of a power switch is typically charged in five nanoseconds or even substantially longer in power converters operating at a switching frequency of the order of 10 MHz.

Figure 6:
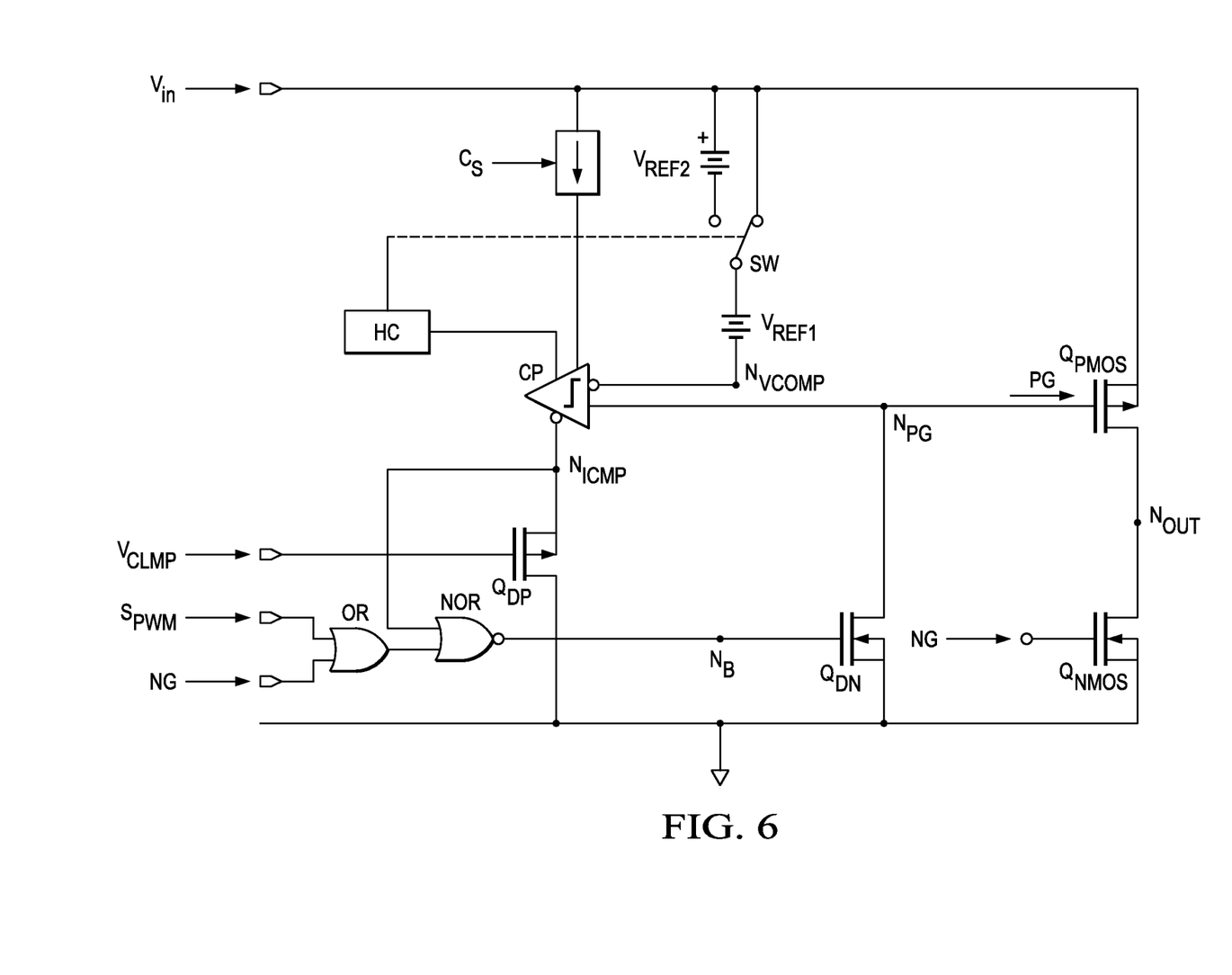
FIG. 6 illustrates a schematic diagram of an embodiment of a pull-down driver for a P-channel metal-oxide semiconductor field-effect transistor power switch according to the principles of the present invention.

Turning now to FIG. 6, illustrated is a schematic diagram of an embodiment of a pull-down driver for a PMOS power switch according to the principles of the present invention. A large gate current for a power switch (e.g., a PMOS power switch $Q_{PMOS}$) at its turn on is supplied from a circuit ground with a pulse whose duration is controlled by a voltage comparator loop including a comparator CP. When the PMOS power switch $Q_{PMOS}$ is off, a node $N_{PG}$ is high, nodes $N_{ICMP}$, $N_B$ are low, and a signal $S_{PWM}$ from a controller and a gate drive signal NG are high. The gate drive signal NG to a power switch (e.g., an NMOS power switch $Q_{NMOS}$) is used by the driver to prevent shoot-through current from both of the power switches $Q_{PMOS}$, $Q_{NMOS}$ being on simultaneously. Delays on the order of a few percent of a switching period of a power converter can also be employed to prevent a shoot-through current. Such delays can be readily provided as necessary by including networks such as resistor-capacitor ("RC") low-pass filters, as is well understood in the art.

When the signal $S_{PWM}$ and then the gate drive signal NG fall, a voltage on node $N_B$ rises, and an NMOS driver switch $Q_{DN}$ pulls down on the gate of the PMOS power switch $Q_{PMOS}$, discharging its capacitance. A voltage at the node $N_{PG}$ (e.g., voltage of the gate terminal of the PMOS power switch $Q_{PMOS}$) is compared to a reference voltage of the node $N_{VCOMP}$ by the comparator CP. As the falling voltage at the node $N_{PG}$ reaches a voltage at the node $N_{VCOMP}$, an output of the comparator CP rises and disables the NMOS driver switch $Q_{DN}$ via a NOR gate (generally designated "NOR"). To provide adequate speed of response, the operating current of the comparator CP is pulsed high when the node $N_{PG}$ is being pulled low. Since the NMOS driver switch $Q_{DN}$ and a current source (designated "$C_S$," and operating according to 1 $\mu$A+200 $\mu$A*B) are pulsed on for only 2.5 ns in a typical 200 ns period, the average currents are low. The rising edge of the output of the comparator CP sets the NOR gate to hold the node $N_B$ low until the signal $S_{PWM}$ or the gate drive signal NG rise again. This prevents a floating node $N_{ICMP}$ at high temperatures, and very low levels of an input voltage $V_{in}$, from causing the NMOS driver switch $Q_{DN}$ to turn back on. Delay elements, as described above, may be included in the driver as is well known in the art as a further mechanism to prevent shoot-through currents from a simultaneous pull-up and pull-down condition. With a high peak current, the slew rate on the node $N_{PG}$ can be about 400 V/μs.

A hysteresis loop including the hysteresis control block (designated "HC") improves logic levels and transitions at the clamped comparator node $N_{ICMP}$ by controlling the voltage coupled to the inverting input of the comparator CP from a first voltage reference $V_{REF1}$ (e.g., 2.4 volts) with a switch SW and a second voltage reference $V_{REF2}$ (e.g., 0.1 volts). For further accuracy, a signal at the node $N_{VCOMP}$ can be developed using a gain and level-shift circuit coupled to a trimmed bandgap voltage.

To prevent overstress of the input gate of the NOR gate, the output of the comparator CP is clamped by a PMOS driver switch $Q_{DP}$ controlled by a voltage at the node $N_{VCLMP}$. This clamping action is performed by providing a voltage $V_{CLMP}$, which is coupled to the gate of the PMOS driver switch $Q_{DP}$. The voltage $V_{CLMP}$ need not be from a low impedance source, and can be provided internally in an integrated circuit from a voltage reference using techniques well known in the art. When the voltage at the node $N_{ICMP}$ exceeds the voltage $V_{CLMP}$ plus the threshold voltage of the PMOS driver switch $Q_{DP}$, the PMOS driver switch $Q_{DP}$ conducts, thereby clamping the voltage at the node $N_{ICMP}$. The clamping action can be improved by adding a current mirror using techniques well known in the art. A weak pull-down circuit using a small NMOS driver switch with source and drain in parallel with NMOS driver switch $Q_{DN}$, driven with logic, can be added to the driver to maintain the voltage of the node $N_{PG}$ after the NMOS driver switch $Q_{DN}$ is turned off. Thus, a dynamic driver is formed with just a dc bias circuit control of the low voltage level of the node $N_{PG}$. The voltage of the node $N_{PG}$ is dependant on the charge storage level of the input capacitance of the PMOS power switch $Q_{PMOS}$. Preferably, a static condition is not allowed in the circuit wherein the PMOS power switch $Q_{PMOS}$ is held on continuously when the input voltage $V_{in}$ is above 2.5 volts. The pull-down gate driver is controlled by the signal $S_{PWM}$ coupled to an OR gate (generally designated "OR"), which is also coupled to the gate drive signal NG previously described with reference to FIG. 4.

Thus, the NMOS driver switch $Q_{DN}$ is referenced to a voltage level (e.g., ground) and is configured to provide a gate drive signal PG to a gate terminal of the PMOS power switch $Q_{PMOS}$ referenced to another voltage level (e.g., the input voltage $V_{in}$) and subject to a control voltage limit (e.g., five volts). A comparator CP of the driver is configured to change a state of the NMOS driver switch $Q_{DN}$ when a voltage at the gate terminal of the PMOS power switch $Q_{PMOS}$ (e.g., voltage at a node $N_{PG}$) passes a threshold voltage (e.g., the input voltage $V_{in}$ minus a first reference voltage $V_{REF1}$, or the input voltage $V_{in}$ minus a first reference voltage $V_{REF1}$ plus a second voltage reference $V_{REF2}$).

Figure 7:
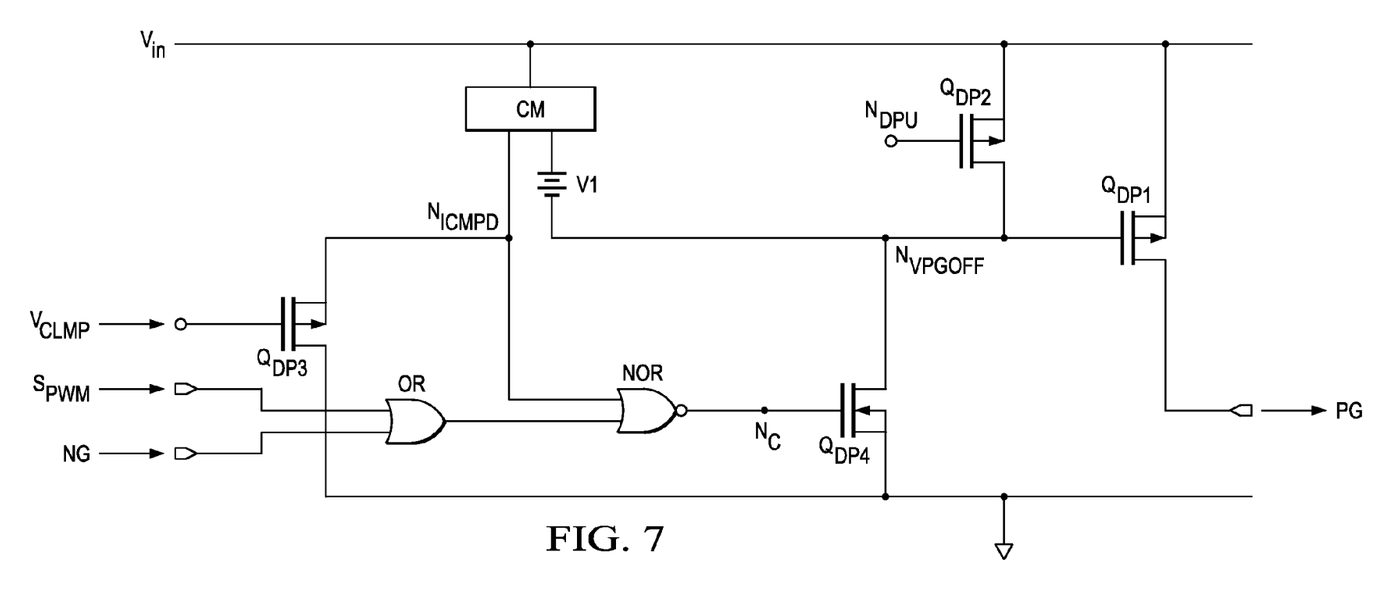
FIG. 7 illustrates a schematic diagram of an embodiment of a pull-up driver for a P-channel metal-oxide semiconductor field-effect transistor power switch according to the principles of the present invention.

Turning now to FIG. 7, illustrated is a schematic diagram of an embodiment of a pull-up driver for a PMOS power switch according to the principles of the present invention. The drive signal to a first PMOS driver switch $Q_{DP1}$ is level shifted to the input voltage $V_{in}$. Inasmuch as the first PMOS driver switch $Q_{DP1}$ is significantly smaller than a typical power switch (e.g., a PMOS power switch $Q_{PMOS}$), there can be a tradeoff of the accuracy of the gate-to-source voltage verses device size, allowing a less complex circuit at the cost of a slightly larger device for the first PMOS driver switch $Q_{DP1}$. The gate voltage of the first PMOS driver switch $Q_{DP1}$ is sensed by comparing the voltage of a node $N_{VPGOFF}$ to an input voltage $V_{in}$ minus two times the gate-to-source threshold voltage of PMOS switches on the input of a current mirror CM. The current mirror CM clamps the voltage at the node $N_{VPGOFF}$ to a value greater than about the input voltage $V_{in}$ minus 2.5 volts.

A clamped level shifter drives a node $N_{DPU}$ to turn a second PMOS driver switch $Q_{DP2}$ on to turn the first PMOS driver switch $Q_{DP1}$ off. A voltage $V_{CLMP}$ is set to one PMOS gate-to-source threshold voltage below the input voltage $V_{in}$, allowing a third PMOS driver switch $Q_{DP3}$ to clamp a voltage at a node $N_{ICMPD}$ to a voltage level less than the input voltage $V_{in}$. The voltage $V_{CLMP}$ need not be from a low impedance source, and can be provided internally in an integrated circuit from a voltage reference using techniques well known in the art. A battery V1 represents the input offset voltage of the current mirror CM, typically about twice the gate-to-source threshold voltage of PMOS switches. The clamping action for node $N_{VPGOFF}$ is provided by the current mirror input offset voltage. A gate drive signal PG connects to the gate of the PMOS power switch $Q_{PMOS}$ as previously described. A fourth PMOS driver switch $Q_{DP4}$ turns on the first PMOS driver switch $Q_{DP1}$, and is controlled by a signal at a node $N_C$ from a NOR gate (generally designated "NOR"). An OR gate (generally designated "OR"), coupled to the input of the NOR gate, responds to a signal $S_{PWM}$ from a controller and a gate drive signal NG that drives a control terminal of the NMOS power switch, previously described, to prevent a shoot-through current through two series-coupled power switches driven by the driver.

Figure 8:
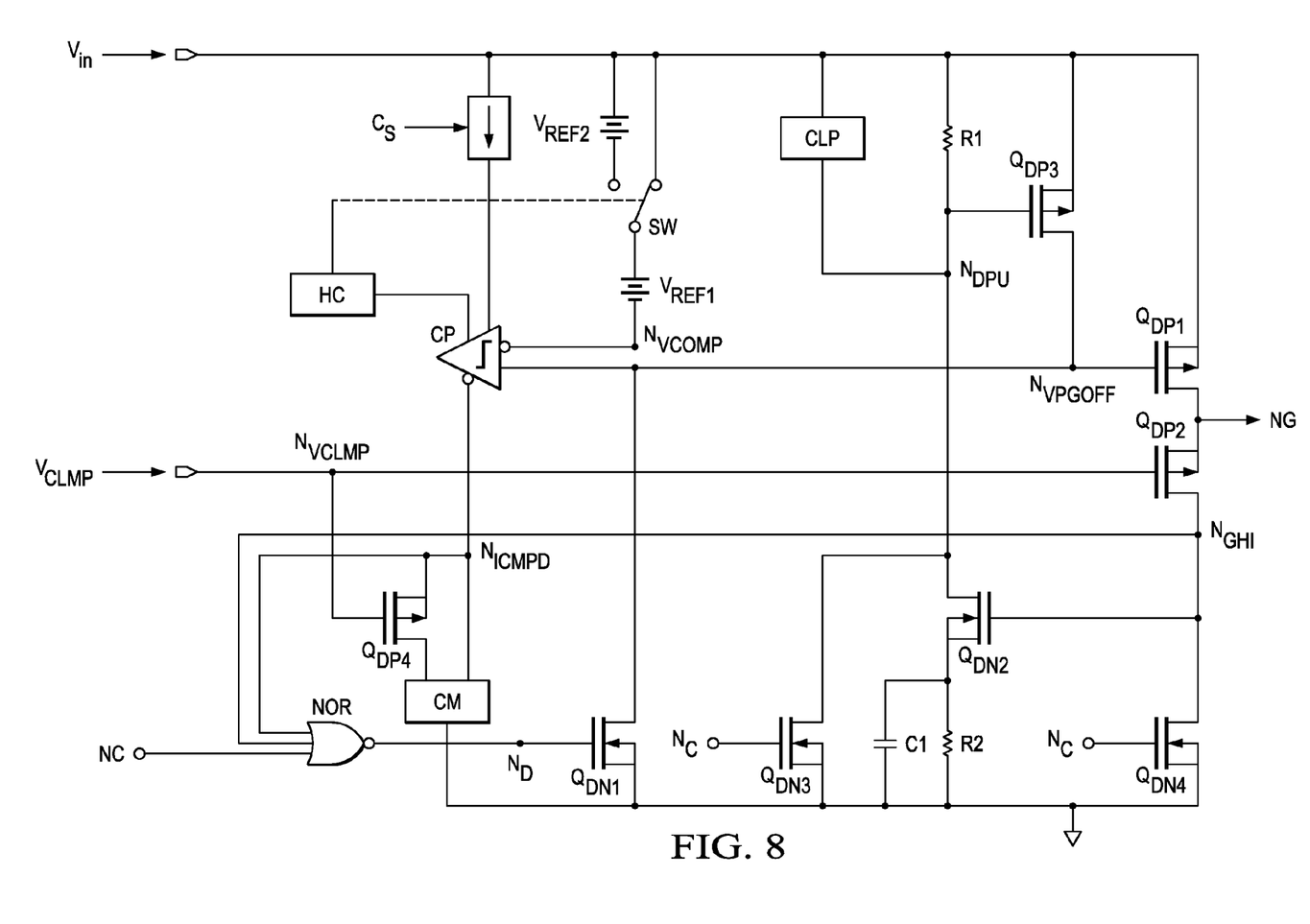
FIG. 8 illustrates a schematic diagram of an embodiment of a pull-up driver for an N-channel metal-oxide semiconductor field-effect transistor power switch according to the principles of the present invention.

Turning now to FIG. 8, illustrated is a schematic diagram of an embodiment of a pull-up driver for an NMOS power switch according to the principles of the present invention. The operation of the driver will hereinafter be described. When the voltage at node $N_C$ (previously described with reference to FIG. 7) is high, the voltage at node $N_{VPGOFF}$ will be high and the voltage at nodes $N_{ICMPD}$, $N_{GHI}$ will be low. At such time, a gate drive signal NG for the NMOS power switch $Q_{NMOS}$ is also low. When the voltage at node $N_C$ falls, the voltage at node $N_D$ will rise and turn a first NMOS driver switch $Q_{DN1}$ on, pulling down the voltage at node $N_{VPGOFF}$, and turning a first PMOS driver switch $Q_{DP1}$ on to pull up the gate drive signal NG. As in the PMOS pull-down driver, a comparator CP and NOR gate (generally designated "NOR") terminate a signal to the first NMOS driver switch $Q_{DN1}$ at about 2.5 volts gate-to-source on the first PMOS driver switch $Q_{DP1}$.

The enhanced speed of operation of comparator CP with selectively controlled current source $C_S$ is similar to the operation as described with respect to FIG. 6. The first PMOS driver switch $Q_{DP1}$ pulls up the gate drive signal NG coupled to the NMOS power switch $Q_{NMOS}$ until the voltage of the gate drive signal NG rises to a voltage of a node $N_{VCLMP}$ plus a gate-to-source threshold voltage of a second PMOS driver switch $Q_{DP2}$, which is, without limitation, essentially 2.5 volts. At that time, current begins to flow in the second PMOS driver switch $Q_{DP2}$, pulling up on the node $N_{GHI}$, and turning on second NMOS driver switch $Q_{DN2}$ and the third PMOS driver switch $Q_{DP3}$ to terminate a signal to the first PMOS driver switch $Q_{DP1}$. A clamp circuit CLP protectively clamps the gate terminal of the third PMOS driver switch $Q_{DP3}$ at about twice the gate threshold voltage thereof. A resistor R1 (about 50 kΩ) is a pull-up resistor for the gate terminal of the third PMOS driver switch $Q_{DP3}$. Since the node $N_{GHI}$ will remain high for a long period, capacitive peaking is used to give a strong turn on signal to the third PMOS driver switch $Q_{DP3}$ without employing a large static current.

Although the signal on the node $N_{VPGOFF}$ to the gate of the first PMOS driver switch $Q_{DP1}$ should terminate before the gate drive signal NG gets pulled high, the signal on the node $N_{GHI}$ is applied to the NOR gate to ensure no conflict exists between the third PMOS driver switch $Q_{DP3}$ and the first NMOS driver switch $Q_{DN1}$. Large output currents from the comparator CP are preferably absorbed in the driver by a fourth PMOS driver switch $Q_{DP4}$ with its gate coupled to the node $N_{VCLMP}$. The fourth PMOS driver switch $Q_{DP4}$ clamps the voltage of the node $N_{ICMPD}$, and its operation may be enhanced by the inclusion of a current mirror such as a 2× current mirror (generally designated "CM").

The time to turn the first PMOS driver switch $Q_{DP1}$ off is set in part by a voltage difference of the input voltage $V_{in}$ minus a voltage at a node $N_{VPGOFF}$, set by a control loop through the NOR gate (so this voltage accuracy also affects the time during which the gate drive signal NG is driven and the accuracy of the peak voltage thereof). Since the voltage at node $N_{VCLMP}$ is set by a PMOS gate-to-source voltage offset from 2.5 volts, the latter also directly affects the gate drive signal NG.

The third NMOS driver switch $Q_{DN3}$, driven by a voltage of the node $N_C$, provides a static pull-down signal to pull down a node $N_{DPU}$, which clamps the signal at the node $N_{VPGOFF}$ at the input voltage $V_{in}$. The fourth NMOS driver switch $Q_{DN4}$, also driven by a voltage at the node $N_C$, provides a pull-down signal for the gate of the second NMOS driver switch $Q_{DN2}$ during the dead times of the driver (i.e., when the gate drive signal NG remains at a static voltage level between voltage transitions). A capacitor C1 and resistor R2 are sized to provide a current pulse into the node $N_{DPU}$ to pull up the node $N_{VPGOFF}$ to the input voltage $V_{in}$ by means of the second NMOS driver switch $Q_{DN2}$.

The circuit illustrated in FIG. 8 senses the voltage of a control terminal of a power switch (via the gate drive signal NG with the second PMOS driver switch $Q_{DP2}$) and terminates operation of a portions of the driver that raises the gate drive signal NG when a voltage thereof exceeds a voltage at the node $N_{VCLMP}$ plus the gate-to-source threshold voltage of the second PMOS driver switch $Q_{DP2}$. Thus, the circuitry functionally operates as a comparator that changes a state of a driver switch (e.g., first PMOS driver switch $Q_{DP1}$) when a voltage of a control terminal of a power switch passes a threshold voltage (in this case, becomes larger than).

Figure 9:
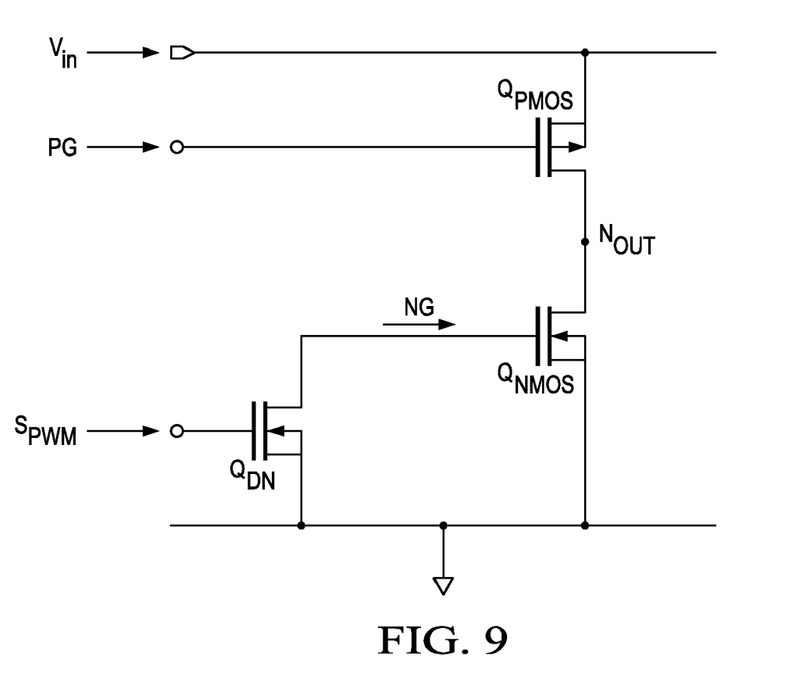
FIG. 9 illustrates a schematic diagram of an embodiment of a pull-down driver for an N-channel metal-oxide semiconductor field-effect transistor power switch according to the principles of the present invention.

Turning now to FIG. 9, illustrated is a schematic diagram of an embodiment of a pull-down driver for an NMOS power switch according to the principles of the present invention. The pull-down driver employs an NMOS driver switch $Q_{DN}$ which is sized to hold a gate drive signal NG near ground potential during high rate of change of the voltage at a node $N_{OUT}$, coupled through the drain-to-gate capacitance of an NMOS power switch $Q_{NMOS}$. The first PMOS driver switch $Q_{DP1}$ (illustrated in FIG. 8) is small compared to the pull-down NMOS driver switch $Q_{DN}$ so that only a small current is supplied by the input voltage $V_{in}$.

Thus, a driver and related method of driving at least one switch of a power converter with readily attainable and quantifiable advantages has been introduced. Those skilled in the art should understand that the previously described embodiments of the driver, related method, and power converter employing the same are submitted for illustrative purposes only and that other embodiments capable of producing a drive signal for a switch referenced to different voltage levels and having a control voltage limit are well within the broad scope of the present invention. It is further recognized that multiple switches may be included in a power converter and ones of the switches may be referenced to the same ground potential as the driver (e.g., "freewheeling switches" that can be driven with customary drivers such as the totem pole driver described above). Thus, a driver according to the principles of the present invention and a customary driver may be included in the design of a power converter.

In one embodiment, the driver is capable of producing a drive signal for a control terminal of a power switch referenced to a voltage level different from the driver. The power switch has a control terminal with a control voltage limit, such as a gate voltage limit, that requires the drive signal to fall within the range of the control voltage limit thereof. The driver for the power switch is beneficially capable of producing the drive signal without the need for a separate voltage bus referenced to the different voltage level of the switch, and without the need for a level-shifting capacitor.

In another embodiment, the driver includes a comparator with an input coupled to a voltage referenced to the different voltage level to set a threshold voltage. The driver also includes a switch coupled to the control terminal of the power switch that pulls the control terminal of the power switch toward the control voltage limit to turn the power switch on in response to an input signal to the driver to initiate a duty cycle of the power switch. In a preferred embodiment, the comparator is configured to change a state of the switch within the driver, i.e., to disable a conduction of the switch, when a voltage at the control terminal of the power switch passes the threshold voltage, thereby limiting the voltage range of the control terminal to the control voltage limit.

Additionally, in an advantageous embodiment, a power converter constructed according to the principles of the present invention may be embodied in an integrated circuit. Alternatively, portions of the power converter such as the driver and the power train (or portions thereof) may also be embodied in an integrated circuit and still be within the broad scope of the present invention. The driver includes switching circuitry with one of a plurality of switches referenced to a different voltage that limit a drive signal to a switch within the control voltage limit thereof. As a result, the power converter can be employed in various applications including conditions wherein the switches are subject to a low gate voltage limit.

Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power converter topologies. While the driver has been described in the environment of a power converter, those skilled in the art should understand that the driver and related principles of the present invention may be applied in other environments or applications such as a power amplifier, motor controller, and a system to control an actuator in accordance with a stepper motor or other electromechanical device.

For a better understanding of power converters see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G.

C. Verghese, Addison-Wesley (1991). The aforementioned references are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. A driver for a switch, comprising:
   switching circuitry having a driver switch referenced to a voltage level and configured to provide a drive signal to a control terminal of said switch referenced to another voltage level and subject to a control voltage limit; and
   a comparator and a combinatorial logic gate configured to:
      disable conduction of said driver switch when a voltage at said control terminal passes a threshold voltage to limit said drive signal within said control voltage limit of said switch, wherein said control voltage limit of said switch is less than a difference between said another voltage level and said voltage level, and
      enable conduction of said driver switch to pull down said control terminal of said switch.

2. The driver as recited in claim 1 wherein said threshold voltage is referenced to said another voltage level.

3. The driver as recited in claim 1 wherein said switching circuitry is configured to turn on said switch in response to a high control signal.

4. The driver as recited in claim 1 wherein said drive signal is a function of a signal to control a duty cycle of said switch and said driver further comprises an operational amplifier and level translator configured to reference said signal to control said duty cycle of said switch to said another voltage.

5. The driver as recited in claim 1 wherein said comparator and said combinatorial logic gate are configured to disable conduction of said driver switch when said voltage at said control terminal of said switch is less than said threshold voltage.

6. The driver as recited in claim 1 wherein said switching circuitry includes another driver switch configured to provide a drive signal to another switch series-coupled with said switch, said drive signal for said another switch being provided with sufficient dead time to prevent a shoot-through current from said switches.

7. The driver as recited in claim 1 wherein said combinatorial logic gate is an AND gate or a NOR gate.

8. A method of driving a switch, comprising:
   providing a drive signal to a control terminal of said switch with switching circuitry having a driver switch referenced to a voltage level, said switch being referenced to another voltage level and subject to a control voltage limit;
   disabling conduction of said driver switch with a comparator and a combinatorial logic gate when a voltage at said control terminal passes a threshold voltage to limit said drive signal within said control voltage limit of said switch, wherein said control voltage limit of said switch is less than a difference between said another voltage level and said voltage level; and
   enabling conduction of said driver switch with said comparator and combinatorial logic to pull down said control terminal of said switch.

9. The method as recited in claim 8 wherein said threshold voltage is referenced to said another voltage level.

10. The method as recited in claim 8 further comprising turning on said switch in response to a high control signal.

11. The method as recited in claim 8 wherein said drive signal is a function of a signal to control a duty cycle of said switch and said method further comprises referencing said signal to control said duty cycle of said switch to said another voltage.

12. The method as recited in claim 8 further comprising disabling conduction of said driver switch with said comparator and combinatorial logic when said voltage at said control terminal of said switch is less than said threshold voltage.

13. The method as recited in claim 8 wherein said switching circuitry includes another driver switch that provides a drive signal to another switch series-coupled with said switch, said drive signal for said another switch being provided with sufficient dead time to prevent a shoot-through current from said switches.

14. The method as recited in claim 8 wherein said combinatorial logic gate is an AND gate or a NOR gate.

15. A power converter couplable to a source of electrical power adapted to provide an input voltage thereto, comprising:
   a power train including a power switch, referenced to said input voltage and subject to a control voltage limit, configured to conduct for a duty cycle and provide a regulated output characteristic at an output of said power converter;
   a controller configured to provide a signal to control said duty cycle of said power switch; and
   a driver configured to provide a drive signal as a function of said signal to control said duty cycle of said power switch, including:
      switching circuitry having a driver switch referenced to a voltage level different from said input voltage level and configured to provide said drive signal to a control terminal of said power switch, and
      a comparator and a combinatorial logic gate configured to:
         disable conduction of said driver switch when a voltage at said control terminal passes a threshold voltage to limit said drive signal within said control voltage limit of said switch, wherein said control voltage limit of said switch is less than a difference between said input voltage level and said voltage level, and
         enable conduction of said driver switch to pull down said control terminal of said power switch.

16. The power converter as recited in claim 15 wherein said combinatorial logic gate is an AND gate or a NOR gate.

17. The power converter as recited in claim 15 wherein said switching circuitry is configured to turn on said power switch in response to a high control signal.

18. The power converter as recited in claim 15 wherein said driver further includes an operational amplifier and level translator configured to reference said signal to control said duty cycle of said switch to said input voltage.

19. The power converter as recited in claim 15 wherein said comparator and said combinatorial logic gate are configured to disable conduction of said driver switch when said voltage at said control terminal of said power switch is less than said threshold voltage.

20. The power converter as recited in claim 15 wherein said switching circuitry includes another driver switch configured to provide a drive signal to another power switch series-coupled with said power switch, said drive signal for said another power switch being provided with sufficient dead time to prevent a shoot-through current from said power switches.

* * * * *